(12) United States Patent
Imoto et al.

(10) Patent No.: US 9,750,169 B2
(45) Date of Patent: Aug. 29, 2017

(54) METHOD FOR MOUNTING ELECTRONIC COMPONENT

(71) Applicant: YAMAHA HATSUDOKI KABUSHIKI KAISHA, Shizuoka (JP)

(72) Inventors: Takuya Imoto, Ora-gun (JP); Tetsuji Ono, Tokyo (JP); Yoshinori Okamoto, Kumagaya (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 207 days.

(21) Appl. No.: 14/388,487

(22) PCT Filed: Feb. 27, 2013

(86) PCT No.: PCT/JP2013/055216
§ 371 (c)(1),
(2) Date: Sep. 26, 2014

(87) PCT Pub. No.: WO2013/146043
PCT Pub. Date: Oct. 3, 2013

(65) Prior Publication Data
US 2015/0013154 A1 Jan. 15, 2015

(30) Foreign Application Priority Data
Mar. 30, 2012 (JP) .................................. 2012-078921

(51) Int. Cl.
*B23P 19/00* (2006.01)
*H05K 13/04* (2006.01)
(Continued)

(52) U.S. Cl.
CPC ............. *H05K 13/04* (2013.01); *B23Q 17/24* (2013.01); *G05B 19/4015* (2013.01);
(Continued)

(58) Field of Classification Search
CPC .... G05B 19/4015; H05K 13/08; H05K 13/04; B23Q 17/24
See application file for complete search history.

(56) References Cited

U.S. PATENT DOCUMENTS

| 7,058,216 B2 * | 6/2006 | Kawada | H05K 13/0413 29/833 |
| 2002/0029468 A1 * | 3/2002 | Koike | H05K 13/0413 29/832 |

(Continued)

FOREIGN PATENT DOCUMENTS

| CN | 101990395 A | 3/2011 |
| JP | A-61-275910 | 12/1986 |

(Continued)

OTHER PUBLICATIONS

Jun. 11, 2013 International Search Report issued in International Application No. PCT/JP2013/055216.

*Primary Examiner* — Minh Trinh
(74) *Attorney, Agent, or Firm* — Studebaker & Brackett PC

(57) ABSTRACT

A method for mounting an electronic component onto a circuit board. The method may include preparing a mounting device including a rotatable mounting head, a holding means to hold the electronic component, a component recognition camera, a memory device, and a microcomputer, the electronic component being mounted onto the circuit board based on a result of performing recognition processing with respect to an acquired image, determining a mid-operation instruction action mode at start of a production operation, executing an instruction of obtaining an offset value relative to a rotation center of the rotatable mounting head and storing the offset value in the memory device at a time interval according to the determined mid-operation instruction action mode, and executing the instruction at a longer (Continued)

time interval when the instruction has continuously met a required accuracy more than once.

1 Claim, 11 Drawing Sheets

(51) Int. Cl.
*B23Q 17/24* (2006.01)
*G05B 19/401* (2006.01)
*H05K 13/08* (2006.01)

(52) U.S. Cl.
CPC ... *H05K 13/08* (2013.01); *G05B 2219/50042* (2013.01); *Y10T 29/49131* (2015.01); *Y10T 29/53087* (2015.01)

(56) References Cited

U.S. PATENT DOCUMENTS

| | | | |
|---|---|---|---|
| 2005/0258381 A1* | 11/2005 | Kawase | H05K 13/0408 250/559.45 |
| 2006/0179645 A1* | 8/2006 | Chikuma | H05K 13/08 29/740 |
| 2010/0180434 A1* | 7/2010 | Moriya | H05K 13/08 29/739 |
| 2012/0240388 A1* | 9/2012 | Ishimoto | H05K 13/0452 29/593 |

FOREIGN PATENT DOCUMENTS

| | | |
|---|---|---|
| JP | A-2004-128008 | 4/2004 |
| JP | A-2005-159209 | 6/2005 |
| JP | 2011-035079 A | 2/2011 |

\* cited by examiner

Fig. 12

| COMPONENT DATA | | COMPONENT SIZE | | |
|---|---|---|---|---|
| Fno | MOUNTING | X SIZE | Y SIZE | COMPONENT TYPE |
| 101 | TO BE MOUNTED | 0.6mm | 0.3mm | SQUARE CHIP |
| 102 | TO BE MOUNTED | 0.4mm | 0.2mm | SQUARE CHIP |
| 103 | TO BE MOUNTED | 20mm | 20mm | QFP |
| 104 | TO BE MOUNTED | 10mm | 10mm | CSP |
| ~ | | | | |
| 999 | NOT TO BE MOUNTED | - | - | - |

Fig. 13

| COMPONENT TYPE | SMALLER ONE OF X AND Y SIZES | REQUIRED ACCURACY |
|---|---|---|
| SQUARE CHIP | 0.5mm OR LESS | 40 $\mu$m |
| SQUARE CHIP | GREATER THAN 0.5mm | 60 $\mu$m |
| CSP | NO RELATION | 40 $\mu$m |
| BGA | NO RELATION | 40 $\mu$m |
| QFP | NO RELATION | 40 $\mu$m |
| SOP | NO RELATION | 40 $\mu$m |

METHOD FOR MOUNTING ELECTRONIC COMPONENT

TECHNICAL FIELD

The present invention relates to a method for mounting an electronic component and a device for mounting an electronic component, which image an electronic component held by holding means provided at a rotatable mounting head with the use of a component recognition camera and mount the electronic component onto a circuit board based on a result of executing recognition processing relative to the acquired image.

BACKGROUND ART

This type of electronic component mounting method for executing component recognition processing is disclosed in, e.g., Patent Literature 1. Based on a result of this recognition processing for an electronic component, the electronic component is accurately mounted on a printed circuit board. Further, it is general to perform instruction of an offset value relative to a rotation center of the mounting head in advance, store it in a memory device, add the offset value to a result of recognition processing of an electronic component at the time of mounting the electronic component onto a printed circuit board, and mount the electronic component.

However, with an increase in temperature of an electronic component mounting device due to continuation of a mounting operation of the electronic component mounting device, a deviation of a positional relationship of the mounting head and others is produced. Therefore, when a single offset value (a fixed value) corresponding to a deviation from a preset position (a design position) of a rotation center of the mounting head based on a result of instruction performed in adjustment of the electronic component mounting device is obtained in advance and it is added at the time of mounting the electronic component, it is not possible to cope with a changing temperature of the device, and a mounting accuracy of the electronic component cannot be stabilized.

CITATION LIST

Patent Literature

Patent Literature 1: Japanese Unexamined Patent Application Publication No. 2005-159209

DISCLOSURE OF INVENTION

Problem to be Solved by the Invention

However, when the number of times of instruction is increased in place of a single offset value to update the off set value, a mounting accuracy is enhanced, but a production time of a circuit board also becomes long with the increase in number of times of instruction, which is not preferable for production efficiency.

It is, therefore, an object of the present invention to improve a mounting accuracy for an electronic component without increasing the number of times of instruction concerning an offset value of a rotation center of amounting head as much as possible.

Means for Solving Problem

Therefore, a first invention is characterized by providing a method for mounting an electronic component by which an electronic component held by holding means provided at a rotatable mounting head is imaged by a component recognition camera and the electronic component is mounted onto a circuit board based on a result of performing recognition processing with respect to an acquired image, the method comprising:

determining a mid-operation instruction action mode at start of a production operation of the circuit board;

executing an instruction of obtaining an offset value relative to a rotation center of the mounting head and storing it in a memory device at an interval according to the determined mid-operation instruction action mode; and executing the instruction at a longer interval than the interval according to the mid-operation instruction action mode when the instruction has continuously met a required accuracy more than once.

A second invention is characterized by providing a method for mounting an electronic component by which an electronic component held by holding means provided at a rotatable mounting head is imaged by a component recognition camera and the electronic component is mounted onto a circuit board based on a result of performing recognition processing with respect to an acquired image, the method comprising:

determining a mid-operation instruction action mode at start of a production operation of the circuit board;

executing an instruction of obtaining an offset value relative to a rotation center of the mounting head and storing it in a memory device at an interval according to the determined mid-operation instruction action mode;

executing the instruction at a longer interval than the interval according to the mid-operation instruction action mode when the instruction has continuously met a required accuracy more than once; and executing the instruction at the interval according to the determined mid-operation instruction action mode if the required accuracy is not met even though the instruction is executed at a longer interval than the interval.

Furthermore, a third invention is characterized by providing a device for mounting an electronic component, which images an electronic component held by holding means provided at a rotatable mounting head with the use of a component recognition camera and mounts the electronic component onto a circuit board based on a result of performing recognition processing with respect to an acquired image, the device comprising:

determining means for determining a mid-operation instruction action mode at start of a production operation of the circuit board;

a first control device that performs control so that an instruction is executed by obtaining an offset value relative to a rotation center of the mounting head and storing it in a memory device at an interval according to the determined mid-operation instruction action mode determined by the determining means; and a second control device that performs control so that the instruction is executed at a longer interval than the interval according to the mid-operation instruction action mode when the instruction has continuously met a required accuracy more than once.

A fourth invention is characterized by providing a device for mounting an electronic component, which images an electronic component held by holding means provided at a rotatable mounting head with the use of a component recognition camera and mounts the electronic component onto a circuit board based on a result of performing recognition processing with respect to an acquired image, the device comprising:

determining means for determining a mid-operation instruction action mode at start of a production operation of the circuit board;

a first control device that performs control so that an instruction is executed by obtaining an offset value relative to a rotation center of the mounting head and storing it in a memory device at an interval according to the determined mid-operation instruction action mode determined by the determining means;

a second control device that performs control so that the instruction is executed at a longer interval than the interval according to the mid-operation instruction action mode when the instruction has continuously met a required accuracy more than once; and a third control device that performs control so that the instruction is executed at the interval according to the determined mid-operation instruction action mode when the required accuracy is not met even though the instruction is executed at a longer interval than the interval.

Effect of the Invention

The present invention can improve a mounting accuracy of an electronic component without increasing the number of times of instruction concerning an offset value of the rotation center of the mounting head as much as possible.

BRIEF DESCRIPTION OF DRAWINGS

FIG. 12 is a view showing type data in accordance with presence/absence of mounting, a size, and a component type of each component arrangement number; and FIG. 13 is a view showing data concerning a required accuracy of each component type.

BEST MODE(S) FOR CARRYING OUT THE INVENTION

Figure 1:
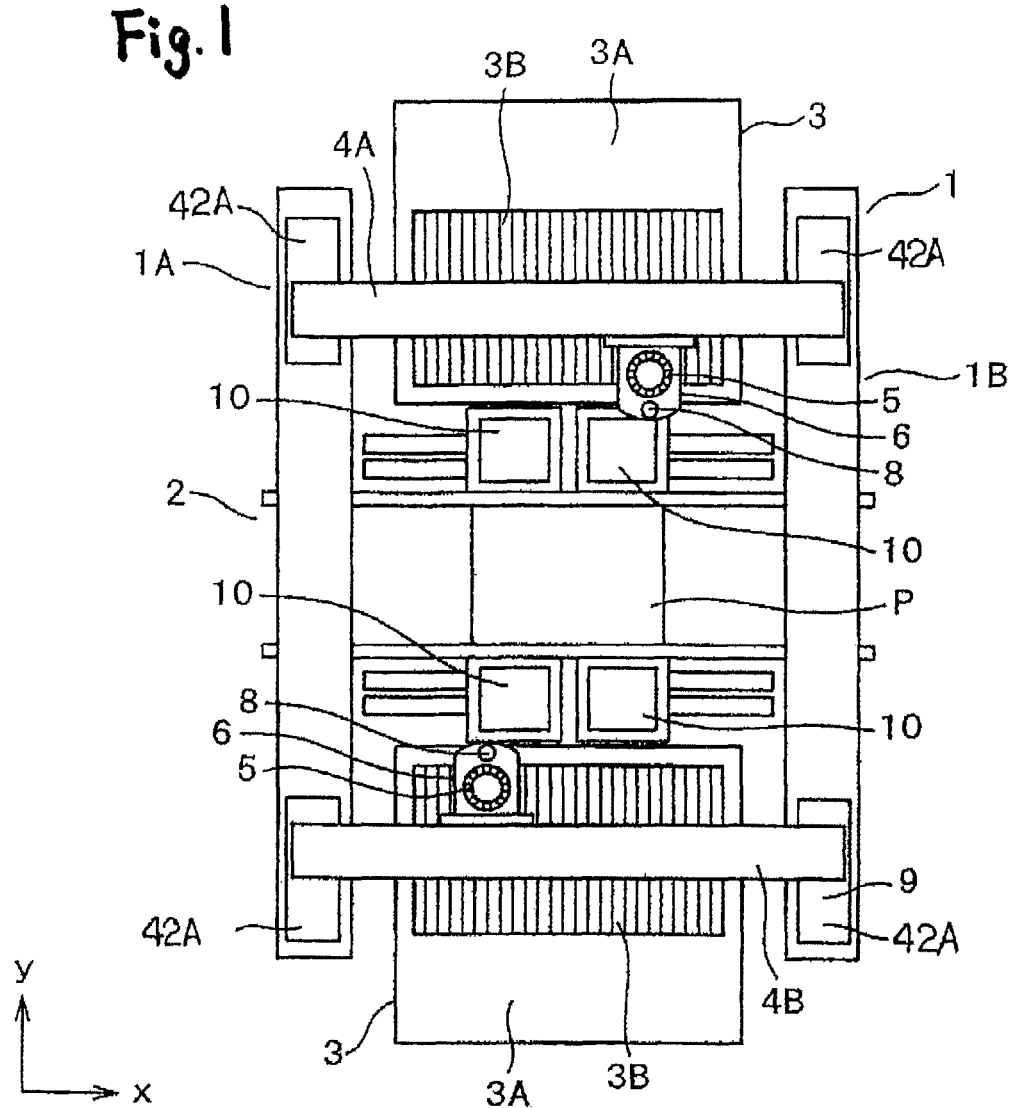
FIG. 1 is a schematic plan view of an electronic component mounting device.

An embodiment of an electronic component mounting device 1 used for mounting an electronic component on a printed circuit board P will now be described hereinafter with reference to FIG. 1. In the electronic component mounting device 1 are provided a conveying device 2 that conveys the printed circuit board P, component supply devices 3 that supply electronic components, a pair of beams 4A and 4B that can move in one direction (a Y direction) by a Y axis motor 42, and mounting heads 6 that includes suction nozzles 5, respectively and can move in a direction (an X direction) parallel to the respective beams 4A and 4B by an X axis motor 43 and rotate.

That is, the suction nozzles 5, which are, e.g., 12 holding means energized downward by respective springs, are arranged at predetermined intervals on a circumference of each of the mounting heads 6 arranged on the beams 4A and 4B.

Further, the suction nozzles 5 can move up and down when a vertical axis motor 46 drives through a drive circuit 45, and each suction nozzle 5 of each mounting head 6 can move in the X direction and the Y direction, rotate around a vertical line, and move up and down when each mounting head is rotated around a perpendicular axis based on driving of a θ axis motor 48 through the drive circuit 45.

The conveying device 2 is constituted of a circuit board supply section that receives the printed circuit board P from an upstream side device (which is placed on the left side in FIG. 1), a circuit board positioning section that positions and fixes the printed circuit board P supplied from the circuit board supply section to mount an electronic component sucked and held by the suction nozzles 5 of each mounting head 6, and a circuit board ejection section that receives the printed circuit board P having the electronic component mounted at this circuit board positioning section and conveys it to a downstream side device (which is placed on the right side in FIG. 1).

The component supply devices 3 are arranged on both outer sides, i.e., a near side and a far side of the conveying device 2, respectively, and each component supply device 3 is constituted of a feeder base 3A disposed to a device main body of the electronic component mounting device 1 and a group of component supply units 3B that are aligned on this feeder base 3A and supply various electronic components to a component suction ejection position one by one.

Furthermore, the pair of front and rear beams 4A and 4B that are long in the X direction individually move in the Y direction when sliders fixed to the respective beams 4A and 4B slide along a pair of guides extending in a front-and-back direction based on driving of the Y axis motor 42. The Y axis motor 42 is constituted of a linear motor formed of a pair of upper and lower stators fixed along a pair of left and right substrates 1A and 1B and movers 42A fixed to lower portions of attaching plates provided on both end portions of the beams 4A and 4B.

The mounting heads 6 that move along guides in the longitudinal direction (the X direction) by the X axis motor 43 are provided on the inner sides of the beams 4A and 4B, respectively, and the X axis motor 43 is constituted of a linear motor formed of a pair of front and rear stators fixed to the respective beams 4A and 4B and a mover that is placed between the respective stators and provided to each mounting head 6.

Therefore, the respective mounting heads 6 are provided on the inner sides of the respective beams 4A and 4B to face each other and move above the printed circuit board P on the circuit board positioning section of the conveying device 2 or the component suction ejection position of each component supply unit 3B.

Furthermore, a circuit board recognition camera 8 is provided to each mounting head 6 and images a positioning mark provided to the positioned printed circuit board P. Based on a position of the positioning mark imaged by this circuit board recognition camera 8, a reference position of the printed circuit board is grasped, and a mounting position indicated by mounting data of an electronic component is grasped. Moreover, the circuit board recognition camera 8 is arranged on a front portion of the mounting head 6 in such a manner that a rotation center of the mounting head 6 coincides with a center of the circuit board recognition camera 8 in the Y axis direction, but it may be arranged on a rear portion of the mounting head 6. Reference numeral 10 denotes each of four illumination units provided in the electronic component mounting device 1, each illumination unit irradiates an electronic component sucked and held by each suction nozzle 5 with illumination light.

Figure 2:
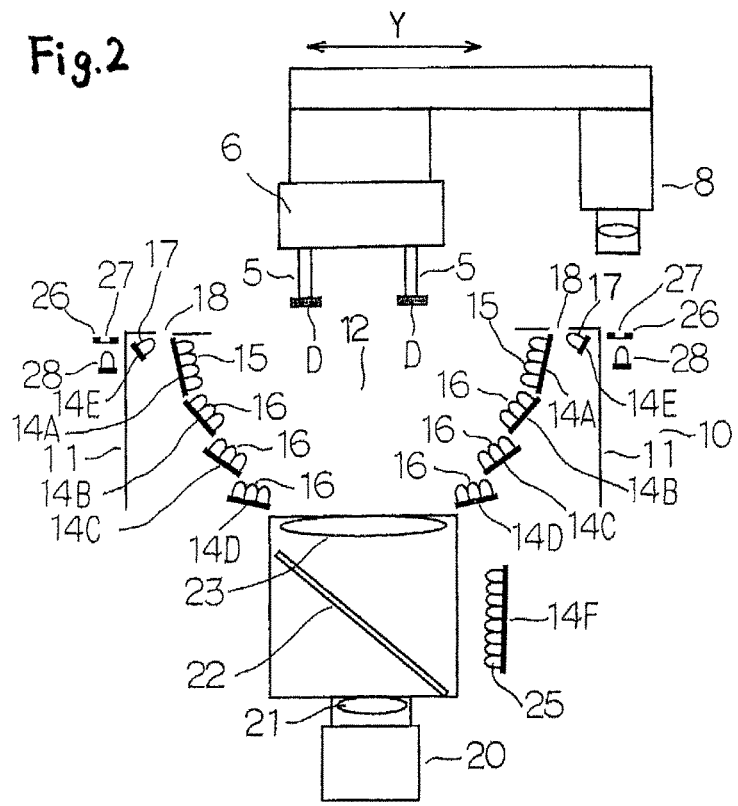
FIG. 2 is a schematic longitudinal cross-sectional view of an illumination device.
Figure 3:
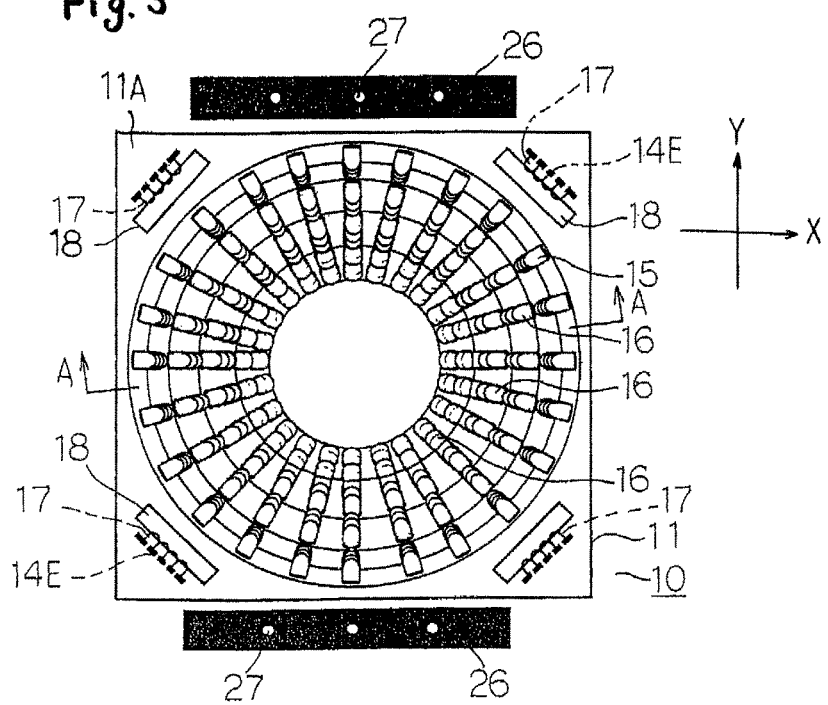
FIG. 3 is a plan view of the illumination device.
Figure 4:
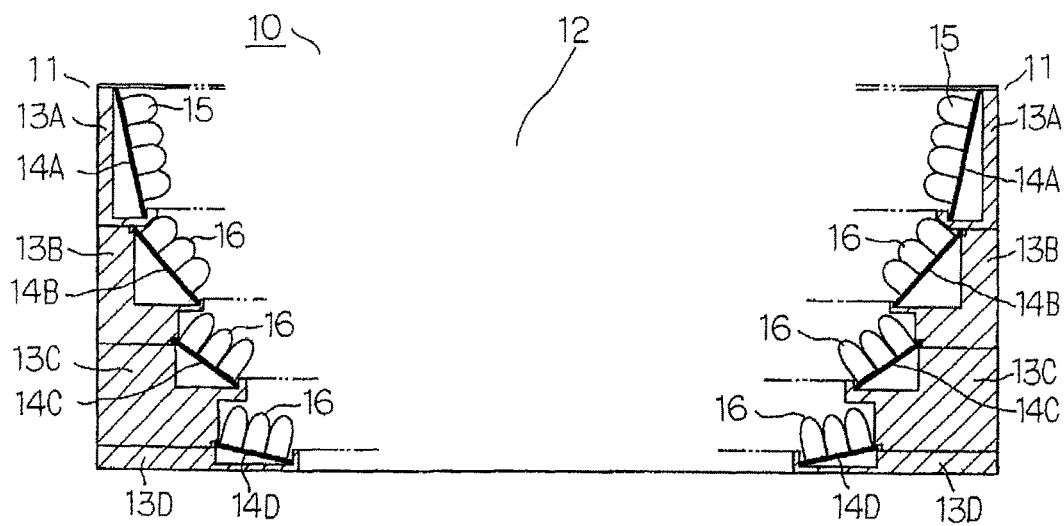
FIG. 4 is a cross-sectional view taken along A-A in FIG. 3.

The illumination unit 10 will now be described in detail hereinafter with reference to FIG. 2 to FIG. 4. A device main body 11 of the illumination unit 10 has a cuboid outer shape, and a through hole 12 which has a circular shape in plane view and a diameter narrowed toward the lower side is formed at a central portion of the device main body 11. Additionally, on an upper portion of an inner peripheral surface of this through hole 12, BGA illumination LEDs (Light Emitting Diodes) 15, which are a plurality of BGA reflection illuminating lamps that irradiate an electronic component D with illumination lights in an inclined state when the electronic component D sucked and held by the suction nozzles 5 is a BGA (Ball Grid Array), are aligned in a plurality of rows, e.g., four rows along the whole circumference in a lateral direction. That is, an annular printed circuit board 14A is disposed on an attaching portion 13A of the uppermost part having an L-shaped cross section in an inclined state to get closer to the center toward the lower side, and the plurality of BGA illumination LEDs 15 are aligned in a plurality rows in the lateral direction, e.g., four rows (four rows in the vertical direction) in the lateral direction (the horizontal direction) at predetermined intervals on this printed circuit board 14A.

Further, an attaching portion 13B having a smaller diameter than the attaching portion 13A is formed below the attaching portion 13A of the uppermost part, an annular printed circuit board 14B is disposed to this attaching portion 13B in a state that it is inclined at an angle that is approximately 15 degrees slanted from the printed circuit board 14A so as to get closer to the center toward the lower side, and a plurality of general reflection illuminating LEDs 16, which are general reflection illuminating lamps, are aligned in a plurality of rows in the lateral direction, e.g., three rows (three rows in the vertical direction) in the lateral direction (the horizontal direction) at predetermined intervals on this printed circuit board 14B.

Furthermore, an attaching portion 13C having a smaller diameter than the attaching portion 13B is formed below the attaching portion 13B, an annular printed circuit board 14C is disposed to this attaching portion 13C in a state that it is inclined at an angle slanted approximately 15 degrees from the printed circuit board 14B to get closer to the center toward the lower side, and a plurality of general reflection illuminating LEDs 16 are aligned in a plurality of rows in the lateral direction, e.g., three rows (three rows in the vertical direction) in the lateral direction (the horizontal direction) at predetermined intervals on this printed circuit board 14C.

Moreover, an attaching portion 13D having a smaller diameter than the attaching portion 13C is formed below the attaching portion 13C, an annular printed circuit board 14D is disposed to this attaching portion 13D in a state that it is inclined at an angle that is slanted approximately 15 degrees from the printed circuit board 14C to get closer to the center toward the lower side, and a plurality of general reflection illuminating LEDs 16 are aligned in a plurality of rows in the lateral direction, e.g., three rows (three rows in the vertical direction) in the lateral direction (the horizontal direction) at predetermined intervals on this printed circuit board 14C.

Reference numeral 17 denotes a transmission illuminating LED disposed on a printed circuit board 14E arranged in an attaching space formed at each of four corners of the device main body 11 having a cuboid shape outside the BGA illumination LEDs 15, the transmission illuminating LED is configured to irradiate a diffusion plate fixed to the suction nozzle 5 through each opening portion 18 opened in a top panel 11A of the device main body 11 with light, and its reflection light is applied from above to the electronic component D sucked and held by each suction nozzle 5.

Further, a component recognition camera 20 is arranged below a central part of the illumination unit 10, a lens 21, a half mirror 22, and a lens 23 are arranged at positions above this component recognition camera 20, and this lens 23 is arranged to face the through hole 12 of the device main body 11 of the illumination unit 10. Furthermore, a half amount of light emitted from coaxial illumination LEDs 25 disposed to a printed circuit board 14F is transmitted by the half mirror 22, and a half amount of the same is reflected to travel upward, applied to the electronic component D sucked and held by the suction nozzles 5 through the lens 23, and its reflection image is acquired by the component recognition camera 20 via the lens 21, the half mirror 22, and the lens 23.

Moreover, reference numerals 26 and 26 denote device reference members of the electronic component mounting device 1 formed by blackly vapor-depositing a coating material with respect to a glass plate except transparent device reference marks 27, and these device reference members are arranged in front and back of the illumination device 10. Additionally, light from one reference mark illumination LED 28 is applied to the corresponding device reference member 26 from below, and a transmission image of the device reference mark 27 is acquired by the circuit board recognition camera 8. Further, any one of the front and rear component recognition cameras 20 can image the electronic component sucked and held by the suction nozzles 5 of the mounting head 6 provided on any one of the front and rear beams 4A and 4B, the device reference mark 27 of the device reference member 26 on the far side is imaged by the circuit board recognition camera 8 provided on the beam 4B on the near side, and the device reference mark 27 of the device reference member 26 on the near side is imaged by the circuit board recognition camera 8 provided on the beam 4A on the far side.

Therefore, as will be described later, the electronic component sucked and held by the suction nozzles 5 of each mounting head 6 is irradiated with the illumination light by the illumination unit 10, each component recognition camera 20 performs imaging, recognition processing is executed, and a positional displacement with respect to a rotation center of the suction nozzles 5 is grasped.

Figure 5:
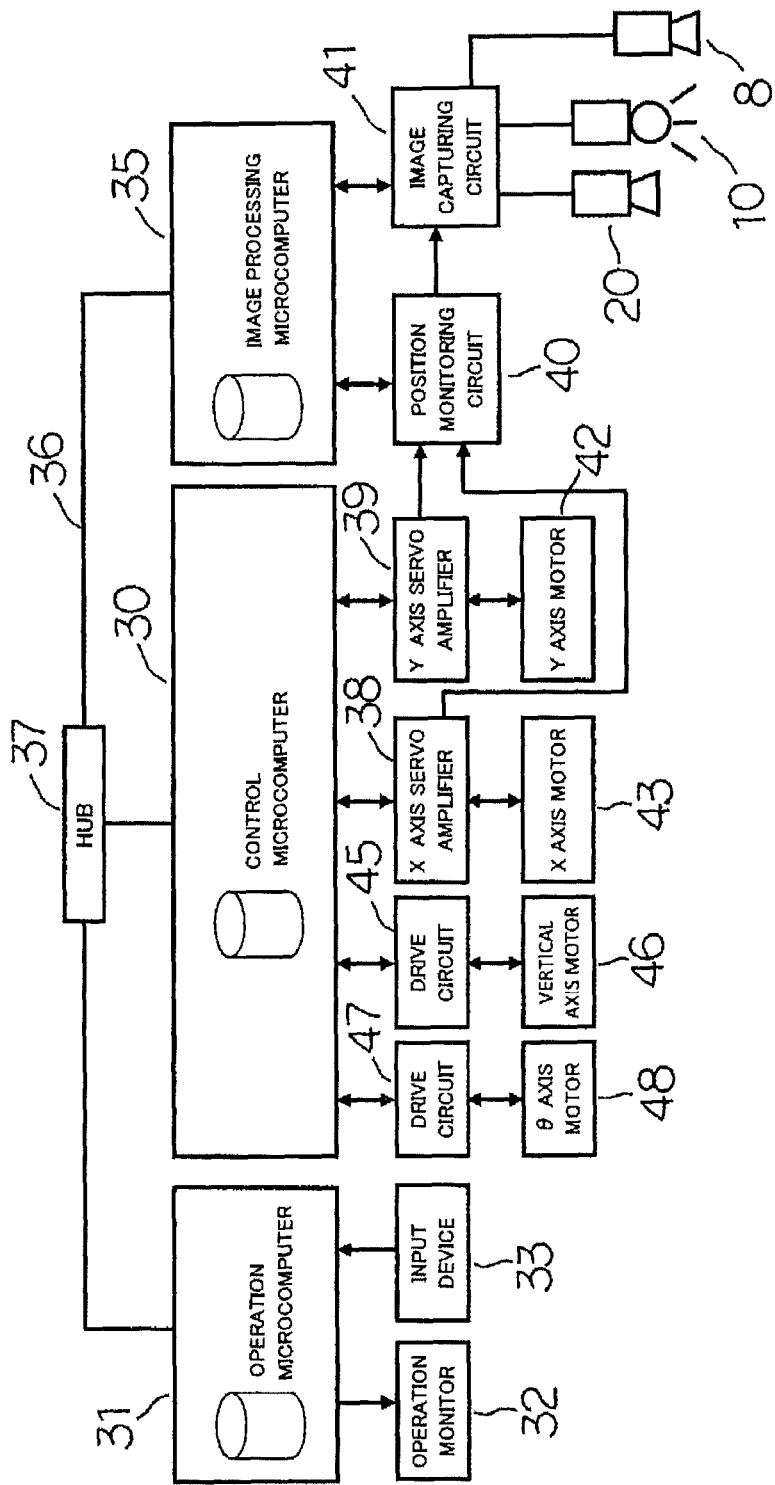
FIG. 5 is a control block diagram.

A description will now be given based on FIG. 5 that is control block diagram concerning imaging control for an electronic component. First, reference numeral 30 designates a microcomputer for control (which will be referred to as a "control microcomputer" hereinafter) as a control device that executes integrated control over operations and others concerning a component mounting operation for mounting an electronic component onto the printed circuit board P in the electronic component mounting device 1, the control microcomputer 30 includes a CPU (a central processing unit) as a control device, a determination device, a comparison device, or the like, an ROM (a read-only memory), an RAM (a random access memory) as a memory device, and the CPU executes control over operations concerning component mounting based on data stored in the RAM in accordance with a program stored in the ROM. It is to be noted that this control microcomputer 30 may constitute a timer or a counter. The RAM stores mounting data representing a mounting coordinate of an electronic component on the printed circuit board P in a mounting order, a mounting angle, a component arrangement number of the component supply unit 3B, and others, component library data which is characteristics of the electronic component, component arrangement data concerning a component ID of each component arrangement number indicative of a component arrangement position of each component supply unit 3B installed on the feeder base 3A, type data indicative of presence/absence of mounting, a size, a component type for each component arrangement number, data concerning a required accuracy for each component type.

Reference numeral 31 denotes an operator's microcomputer for operations (which will be referred to as an "operation microcomputer", and this microcomputer includes a CPU, an ROM, and an RAM and stores the above-described NC data, component library data, optimization data, and others, and an operation monitor 32 and an input device 33 such a touch panel switch displayed in this monitor 32, a keyboard, or a mouse are connected to this operation microcomputer 31.

Reference numeral 35 designates an image processing microcomputer as an image processing device (which will be referred to as an "image processing microcomputer" hereinafter), and this microcomputer includes a CPU, an ROM, and an RAM and stores the above-described component library data, positional data of the circuit board recognition camera 8 at the time of capturing an image (positional data of the circuit board recognition camera 8 for determining image capturing timing) and others.

It is to be noted that the control microcomputer 30, the operation microcomputer 31, and the image processing microcomputer 35 do not necessarily have to be individual members, and one or two microcomputers may act as the control microcomputer 30, the operation microcomputer 31, and the image processing microcomputer 35.

Further, the control microcomputer 30, the operation microcomputer 31, and the image processing microcomputer 35 are connected to each other through an LAN line 36 and a hub 37. Furthermore, an X axis servo amplifier 38 for the X axis motor 43 and a Y axis servo amplifier 39 for the Y axis motor 42 are connected to the control microcomputer 30.

Reference numeral 40 denotes a position monitoring circuit including a memory device, and this circuit receives pulse signals corresponding to moving distances from the driven X-axis motor 43 and Y axis motor 42 (both of which has an encoder function) and generates a position matching signal to an image capturing circuit 41 if the signals coincide with positional data of the circuit board recognition camera 8 (which is positional data of the circuit board recognition camera 8 at the time of capturing an image and is stored in the image processing microcomputer 35). The image capturing circuit 41 that has received the position matching signal outputs an image capturing signal to the circuit board recognition camera 8 and the component recognition camera 20, performs exposure, turns on one reference mark illumination LED 28 of each illumination unit 10 and various illumination LEDs in a predetermined pattern, and captures (acquires) images of the device reference mark 27 and the mounting head 6 (an electronic component).

Moreover, as will be described later, image data of images acquired by the circuit board recognition camera 8 and the component recognition camera 20 is supplied to the image processing microcomputer 35 via the image capturing circuit 41 and subjected to recognition processing, and a positional displacement relative to the suction nozzles 5 can be grasped.

Figure 6:
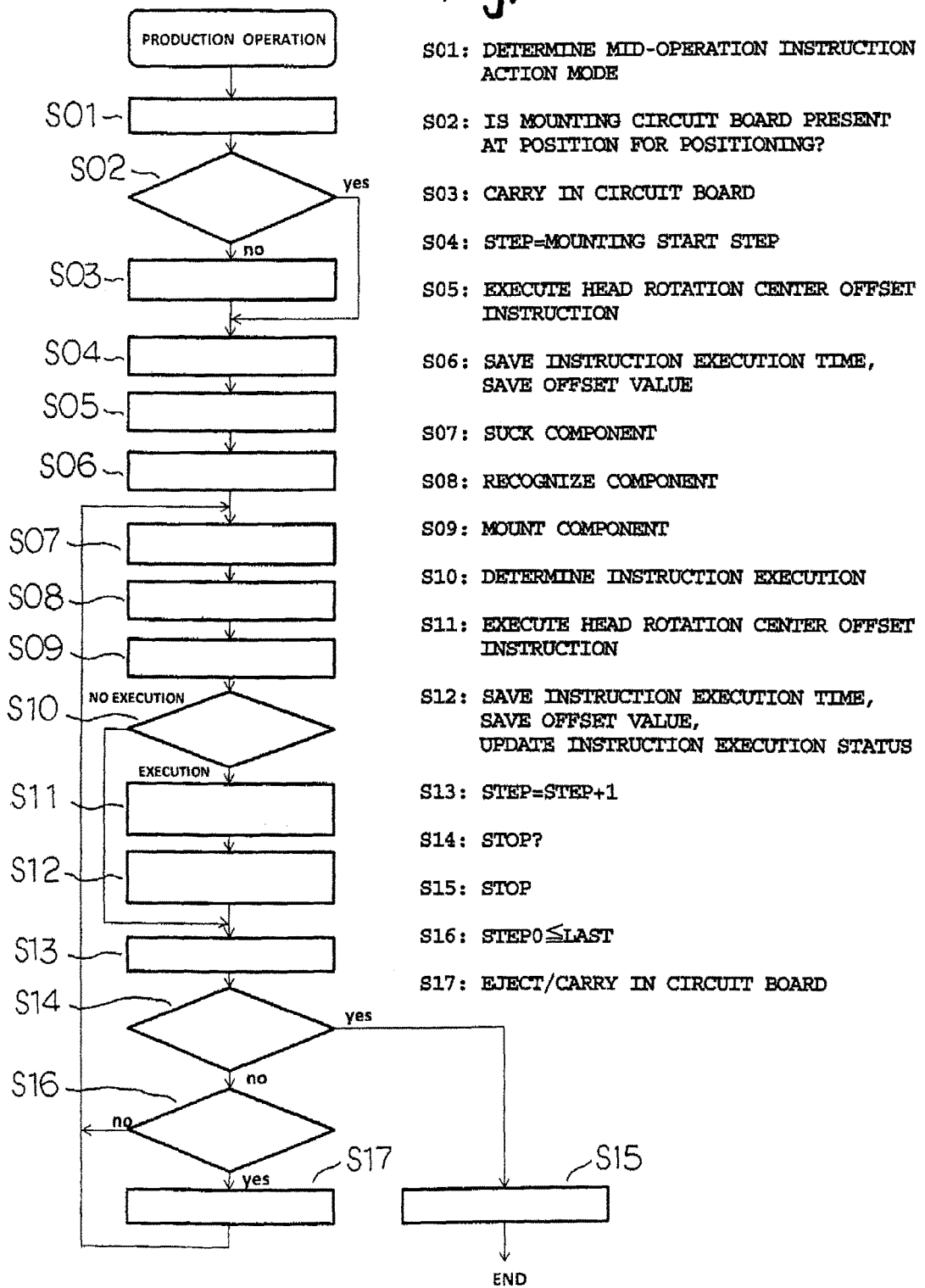
FIG. 6 is a view showing a flowchart concerning production of a printed circuit board.

Here, in a production plant of a printed circuits board of the electronic component mounting device 1 or a manufacturing plant of the electronic component mounting device 1, instruction of a rotation center of each mounting head 6 executed at the time of preproduction adjustment (at the time of adjustment before starting production) of the printed circuit board P will now be described hereinafter with reference to FIG. 6 and FIG. 10. First, an operation manager performs adjustment to match an optical axis of the component recognition camera 20 to an optical axis of the circuit board recognition camera 8. That is, a displacement amount of the optical axis of the component recognition camera 20 from a design value relative to the optical axis of the circuit board recognition camera 8 is corrected so that reference positions (origin positions) of both the optical axes in the X and Y directions can coincide with each other.

Then, the operation manager operates the input device 33 and moves the mounting head 6 in such a manner that a design rotation center of the mounting head 6 can coincide with the center of the component recognition camera 20. Therefore, a position of the mounting head 6 is fixed (the mounting head 6 is stopped) at a position where the design rotation center (a design value) of the mounting head 6 coincides with the center of the component recognition camera 20.

At the position where this mounting head 6 is fixed, when the operation manager operates the input device 33 to drive the θ axis motor 48 through the drive circuit 47, the mounting head 6 in a state that a glass jig having a recognition mark thereon is sucked by the plurality of suction nozzles 5 is rotated every predetermined angle, the recognition mark on the glass jig is imaged by the component recognition camera 20, this process is repeated more than once, acquired images are subjected to recognition processing by the image processing microcomputer 35, and the control microcomputer 30 obtains the rotation center (pre-instruction) of the mounting head 6 based on a result of this recognition processing and stores it in its own memory device.

The obtained and stored rotation center of the mounting head 6 is a displacement amount from the design rotation center of the mounting head 6 within a horizontal plane in the X and Y directions (an offset value of the rotation center of the mounting head 6).

On the other hand, instruction of a position of the device reference mark 27 executed at the time of preproduction adjustment of the printed circuit board will now be likewise described hereinafter with reference to FIG. 7 and FIG. 10. First, based on a screen shown in the operation monitor 32, the operator manager performs adjustment to match an actual rotation center of the mounting head 6 with the center of the component recognition camera 20. That is, based on an operation of the input device 33, the operation microcomputer 31 controls the X axis motor 43 and the Y axis motor 42 through the control microcomputer 30 to move the mounting head 6 so that the actual rotation center of the mounting head 6 obtained by the operation in FIG. 6 is placed on the center of the component recognition camera 20, then carries out adjustment, and matches the actual rotation center of the mounting head 6 with the center of the component recognition camera 20.

In a state that the actual rotation center of the mounting head 6 is matched with the center of the component recognition camera 20, the circuit board recognition camera 8 images the device reference mark 27 provided on the device reference member 26, the image processing microcomputer 35 executes the recognition processing with respect to the imaged device reference mark 27, and the control microcomputer 30 obtains a position of the device reference mark 27 while using the screen center in an imaging screen of the circuit board recognition camera 8 as the origin and stores this position in its own memory device.

The position (pre-instruction) of the device reference mark 27 that is a result of this recognition processing is a displacement amount from the center of the circuit board recognition camera 8, namely, this positional displacement amount is an offset value of the circuit board recognition camera 8 based on the device reference mark 27.

A description will now be given as to an operation of mounting an electronic component onto the printed circuit board P after the above-described instruction is performed after the preproduction adjustment of the printed circuit board P. First, as shown in FIG. 6, when a production operation is started based on an operation of a production operation switch, the control microcomputer 30 determines a mid-operation instruction action mode (a step S01). That is, the control microcomputer 30 controls to execute such instruction action mode determination processing as shown in FIG. 7 that is a flowchart concerning this determination.

That is, first, a component arrangement number "101" of the component supply unit 3B is set (a step S21), whether an electronic component in this component supply unit 3B of "101" is an electronic component to be mounted is determined based on mounting data (a step S22), a required accuracy is set to "0" if the electronic component is an unused electronic component that is not to be mounted (a step S23), and a subsequent component arrangement number "102" is set (a step S27). Further, if the electronic component in this component supply unit 3B of "101" has been determined to be the electronic component to be mounted, sizes of the electronic components in the component supply unit 3B having the component arrangement number "101" in the X direction and the Y direction are acquired from the mounting data (a step S24), a type of this electronic component of "101" is acquired from FIG. 12 (a step S25), a required accuracy of this electronic component is determined from FIG. 13 showing data concerning the required accuracy for each component type (a step S26), and a subsequent component arrangement number "102" is set (a step S27).

Figure 8:
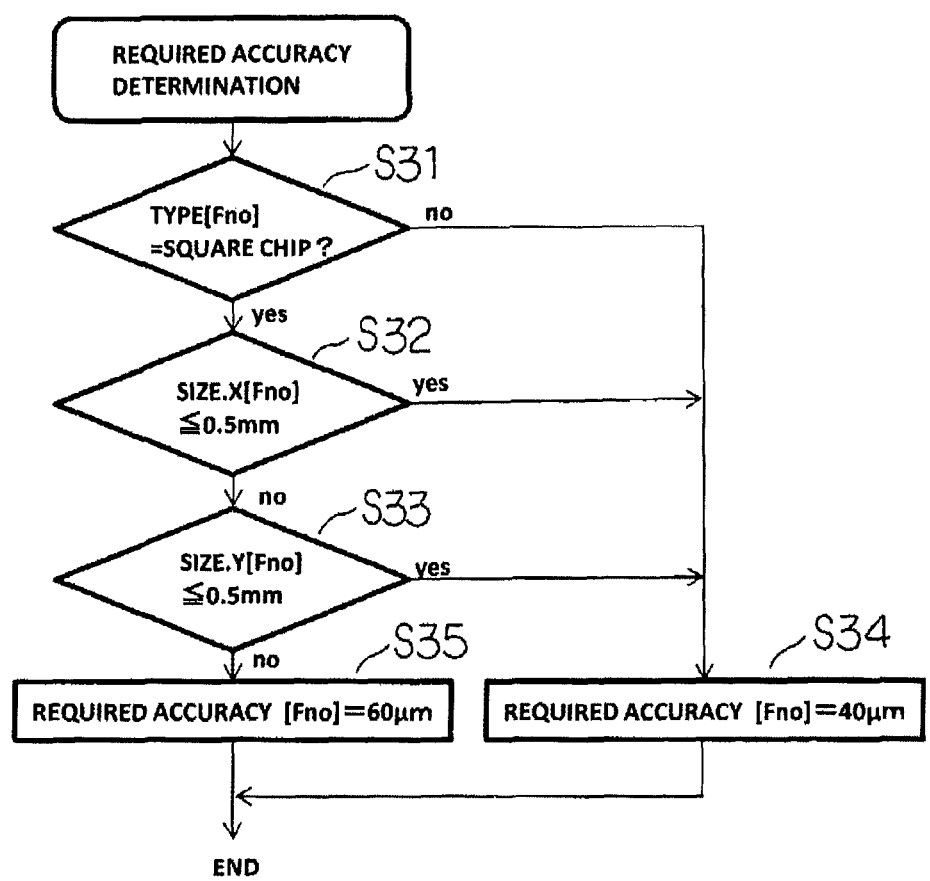
FIG. 8 is a view showing a flowchart concerning required accuracy determination.

This required accuracy determination is based on a flowchart of FIG. 8. That is, first, whether the electronic component of the component arrangement number "101" is a square chip is determined based on a table in FIG. 12 (a step S31), and the request accuracy is determined as 40 μm if the electronic component is not the square chip, but the electronic component having the component arrangement number "101" is the square chip, and hence whether the size in the X direction is 0.5 mm or less is subsequently determined (a step S32).

Since the size of the electronic component having the component arrangement number "101" in the X direction is 0.6 mm, the processing advances to a step S33, whether the size in the Y direction is 0.5 mm or less is determined (the step S33), this size is 0.5 mm or less, and hence the required accuracy is determined as 40 μm. It is to be noted that, if the size in the Y direction is not 0.5 mm or less, the required accuracy is determined as 60 μm (a step S35).

Figure 7:
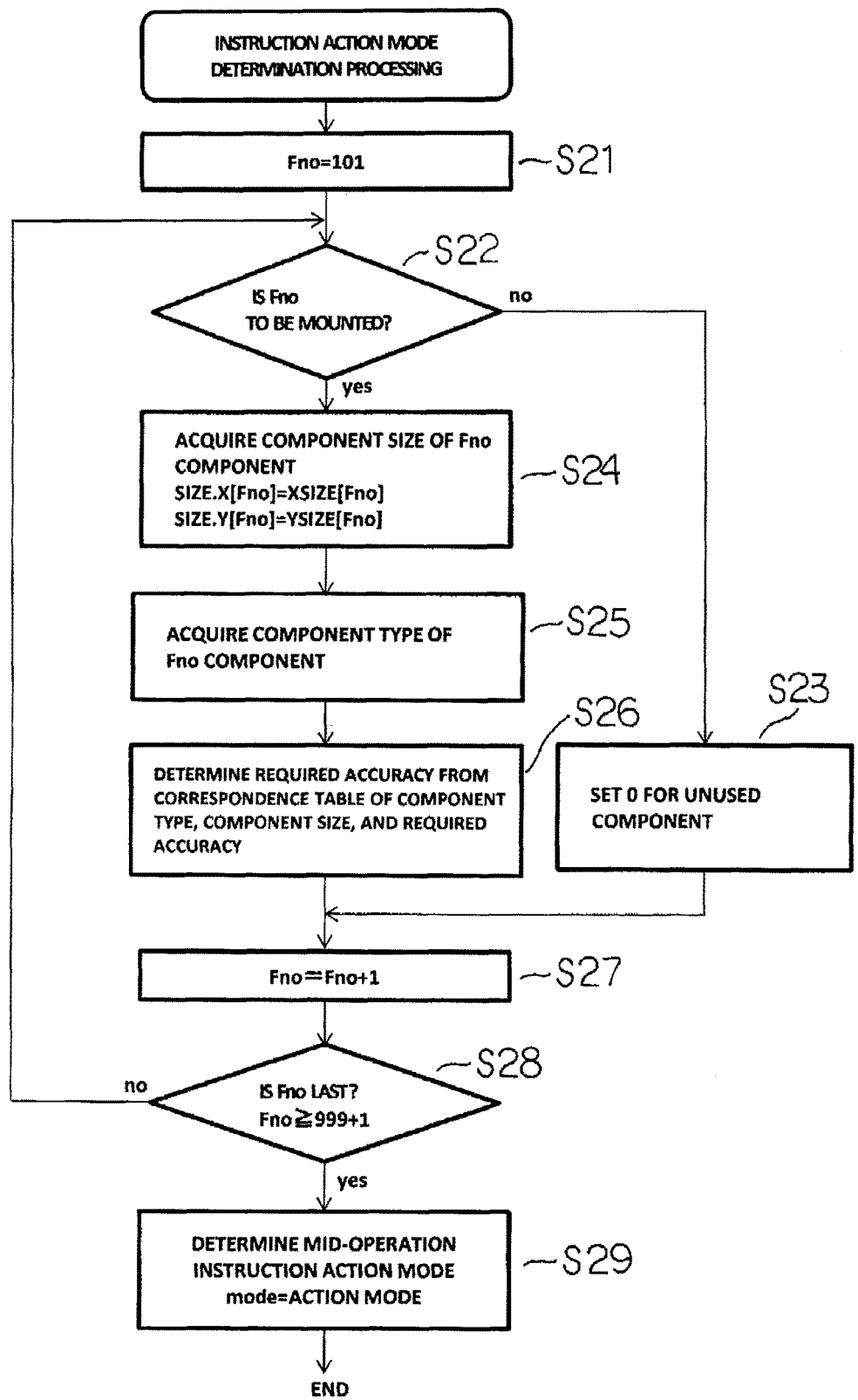
FIG. 7 is a flowchart concerning mid-operation instruction action mode determination processing.

As described above, when the required accuracy of the electronic component is determined, the processing returns to FIG. 7, the subsequent component arrangement number "102" is set (the step S27), the processing of returning to the step S22 is repeated until the component arrangement number becomes the last number (a step S28), and the control microcomputer 30 determines the mid-operation instruction action mode when the last component arrangement number is reached (a step S29).

Figure 9:
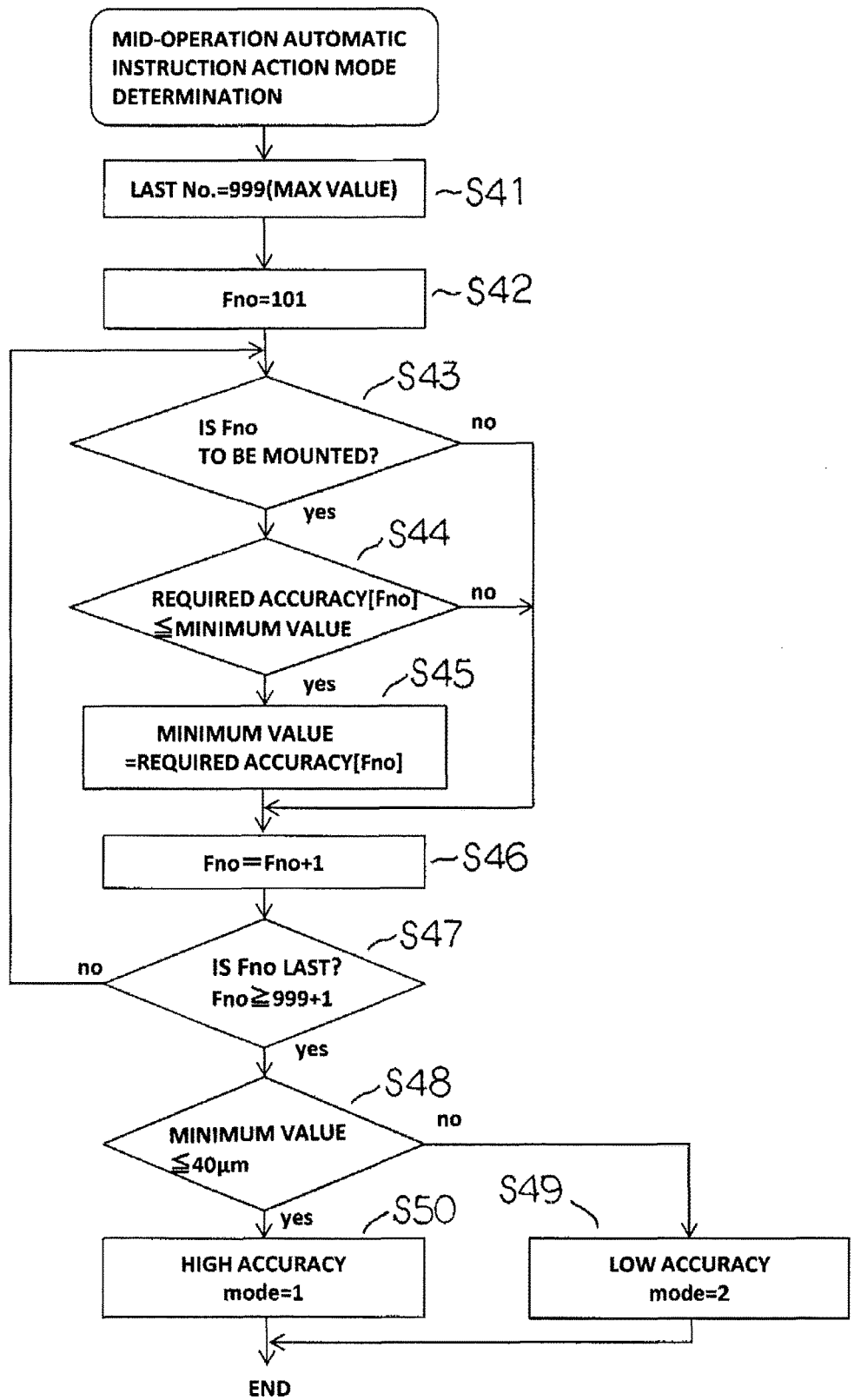
FIG. 9 is a view showing a flowchart concerning the mid-operation instruction action mode determination.

The determination of this mid-operation instruction action mode is based on a flowchart of FIG. 9. That is, the control microcomputer 30 sets the component arrangement number for installation in the feeder base 3A to the last number "999" (a step S41) and then sets the same to "101" (a step S42). As to the component supply unit 3B having this component arrangement number "101", whether mounting is to be performed is determined based on the mounting data (a step S43), "1" is added to the component arrangement number "101" to provide "102" in case of the electronic component that is not to be mounted (a step S46), but whether the required accuracy of this electronic component is a minimum value (40 μm) or less is determined in case of the electronic component to be mounted (a step S44).

In this case, since the electronic component to be mounted with the component arrangement number "101" has the required accuracy of 40 μm according to FIG. 13, the control microcomputer 30 sets the required accuracy to the minimum value (40 μm) (a step S45) and adds "1" to the component arrangement number "101" to set "102" (a step S46).

Then, whether the component arrangement number is the last one is determined (a step S47), the processing returns to the step S43 if the number is not the last one, this process is repeated until the last number is provided, or whether the minimum value of the required accuracies of all the electronic components mounted on this printed circuit board P are 40 μm or less is determined if the last number is provided (a step S48), and a mode "2" that the required accuracy is a low accuracy is set if the required accuracy is not 40 μm or less (a step S49), or a mode "1" that the required accuracy is a high accuracy is set if the required accuracy is 40 μm or less (a step S50).

Furthermore, again referring to FIG. 6, when the control microcomputer 30 has determined the mid-operation instruction action mode (a step S01), whether the printed circuit board P is present on the circuit board positioning section is determined (a step S02), an operation of mounting the electronic component onto the printed circuit board P is started if the printed circuit board P is present (a step S04), or the printed circuit board P is carried into the circuit board positioning section if the electronic component is not present (a step S03), and an operation of mounting the electronic component is also started (the step S04).

Then, the control microcomputer 30 executes offset instruction of the rotation center of the mounting head 6 (a step S05) and stores an instruction execution time and an offset value in the RAM as a memory device (a step S06).

That is, with an increase in temperature of the electronic component mounting device 1 due to continuation of the electronic component mounting operation, since each section of the device, e.g., the mounting device 6 or a linear scale expands with heat and a displacement occurs in a positional relationship of the mounting head 6 and others, the offset value of the rotation center of the mounting head 6 based on a result of the instruction performed at the time of the preproduction adjustment of the printed circuit board P of the electronic component mounting device 1 cannot cope with a changing device temperature, and a mounting accuracy of the electronic component is not stabilized.

Thus, offset instruction of the rotation center of the mounting head 6 for temperature compensation is automatically executed during the production operation of the printed circuit board P of the electronic component device 1. At first, the mounting head 6 is moved to match the center of the component recognition camera 20 with the rotation center of the mounting head 6 obtained by the instruction performed at the time of the preproduction adjustment of the printed circuit board.

Then, when the θ axis motor 48 is driven through the drive circuit 47, an operation of rotating this mounting head 6 every predetermined angle and imaging the suction nozzles 5 by the component recognition camera 20 is repeated more than once, the image processing microcomputer 35 executes recognition processing of the acquired images, and the control microcomputer 30 obtains the rotation center of the mounting head 6 based on a result of the recognition processing, obtains a displacement amount (a rotation center difference Δ of the mounting head) relative to the rotation center of the mounting head 6 acquired by the instruction carried out at the time of the preproduction adjustment of the rotation center of the mounting head 1 obtained by the current temperature compensation instruction, and stores it in its own memory device.

Further, in a state that the rotation center of the mounting head 6 obtained by the instruction performed at the time of the preproduction adjustment of the printed circuit board of the electronic component 1 is matched with the center of the component recognition camera 20, the temperature compensation instruction is carried out. That is, the circuit board recognition camera 8 images the device reference mark 27 provided on the device reference member 26, the image processing microcomputer 35 executes the recognition processing with respect to this imaged device reference mark 27, and the control microcomputer 30 obtains a position of the device reference mark 27 based on a result of the recognition processing and stores it in its memory device.

Furthermore, the control microcomputer 30 obtains a displacement amount (a device reference mark position difference Δ) of the position of the device reference mark 27 acquired by this current temperature compensation instruction relative to the position of the device reference mark 27 acquired by the preproduction instruction and stores it in its own memory device.

Therefore, the control microcomputer 30 obtains a displacement amount of the rotation center of the mounting head 6 (a result of the temperature compensation instruction) based on the optical axis of the circuit board recognition camera 8 from the displacement amount of the rotation center of the mounting head 6 acquired by the above-described temperature compensation instruction and the displacement amount of the position of the device reference mark 27, stores it in its own memory device, and exploits a result of the instruction which is the stored displacement amount to the component recognition processing at the time of mounting subsequent electronic components. Additionally, this temperature compensation instruction is carried out as required, and a positional displacement of the electronic component relative to the mounting head 6 (a positional displacement relative to a position where mounting should be carried out) is calculated based on the rotation center of the mounting head 6 obtained from a result of the latest temperature compensation instruction in the component recognition processing executed at the time of mounting subsequent electronic components. The positional displacement of this recognition processing result relative to the mounting head 6 is corrected, and the electronic component is mounted at a position where mounting should be performed. Therefore, it is possible to appropriately cope with a changing device temperature and improve a device accuracy of the electronic component.

Further, when the offset instruction of the rotation center of the mounting head 6 is execute (a step S05), for example, the beam 4A on the far side moves in the Y direction by driving of the Y axis motor 42 and the mounting head 6 moves in the X direction by the X axis motor 43 in accordance with the mounting data, the electronic component having a step number 0001 in the mounting data is moved to a position above a component taking-out position of the component supply unit 3B to which the electronic component is supplied, the suction nozzles 5 are moved down by driving of the vertical axis motor 46, and the electronic component is taken out of the component supply unit 3B (a step S07). In this case, when the mounting head 6 is moved in the X direction and also rotated and each suction nozzle 5 is moved up and down, the mounting data can be clipped for linkage suction to perform the linkage suction that the plurality of suction nozzles 5 sequentially take out up to 12 electronic components from the component supply unit 3B.

Furthermore, after the suction nozzles 5 of the mounting head 6 on the far side take out the electronic component or while the suction nozzles 5 are taking out the same, the suction nozzles 5 of the mounting head 6 of the beam 4B on the near side can likewise take out the electronic component from the component supply unit 3B.

Moreover, after taking out, the suction nozzles 5 of both the mounting heads 6 are moved up, and capture of images by the component recognition camera 20 begins. In this case, the suction nozzles 5 that are sucking and holding the electronic component to be imaged perform fly imaging while moving, the control microcomputer 30 controls the X axis motor 43 through the X axis servo amplifier 38 to move the mounting head 6 in the X direction in such a manner that a position of the mounting head 6 to be imaged in the X direction is matched with a position of the component recognition camera 20 in the X direction, and it further arranges the rotation center of the mounting head 6 and the center of the component recognition camera 20 on the same Y axis line.

After this arrangement, the control microcomputer 30 outputs a command concerning image capturing to the image processing microcomputer 35. Moreover, fly imaging recognition is performed, the component recognition camera 20 or the beam 4A or 4B is designated, and a position of the mounting head 6 of the designated beam 4A or 4B in the Y direction is monitored.

That is, although the mounting head 6 on the far side or the near side passes above the component recognition camera 20 on the far side or the near side by driving of the Y axis motor 42 of the beam 4A or 4B, since a position of the circuit board recognition camera 8 on the far side or the near side in the Y direction is matched with a position of the mounting head 6 on the far side or the near side in the Y direction before passing, the position monitoring circuit 40 inputs a pulse signal indicative of a moving distance from the Y axis motor 42 and supplies a position matching signal to the image capturing circuit 41 when the pulse signal coincides with positional data of the circuit board recognition camera 8 (positional data obtained by adding the offset value of the circuit board recognition camera 8 at the time of adjustment to the set position of the circuit board recognition camera 8), and the image capturing circuit 41 that has received this position matching signal outputs an image capturing signal to the circuit board recognition camera 8 and the component recognition camera 20 to perform exposure and also turns on one reference mark illumination LED 28 of the illumination unit 10 and various illumination LEDs at the same time.

In this case, in the illumination unit 10, the BGA illumination LEDs 15, the general reflection illuminating LEDs 16, the transmission illuminating LEDs 17, and the coaxial illumination LEDs 25 are turned on in a predetermined illumination pattern simultaneously with lighting of one reference mark illumination LED 28.

Therefore, images of the device reference mark 27 and the electronic component are captured at the same time, image data concerning the captured images is supplied from the image capturing circuit 41 to the image processing microcomputer 35, the device reference mark 27 and the electronic component are subjected to the recognition processing (a step S08), and a result of the recognition processing is supplied from the image processing microcomputer 35 to the control microcomputer 30.

In this case, when the position of the device reference mark 27 is subjected to positional recognition and the position of the device reference mark 27 is grasped, since a distance between the rotation center of the mounting head 6 and the center of the circuit board recognition camera 8 is determined and grasped, the position of the mounting head 6 can be grasped while adding a displacement amount from the design rotation center of the mounting head 6 (the offset value of the rotation center of the mounting head 6 at the time of the adjustment), and the position of the electronic component relative to the mounting head 6 (the suction nozzles 5) can be thereby grasped by performing the recognition processing with respect to the electronic component.

Therefore, the control microcomputer 30 adds a result of the positional recognition of each electronic component to a device coordinate of the electronic component in the NC data, the suctions nozzles 5 correct a positional displacement, and each electronic component is mounted onto the printed circuit board P (a step S09). That is, the X and Y directions and each suction nozzle 5 of each mounting head 6 are corrected by the Y axis motor 42 and the X axis motor 43 corresponding to the respective beams 4A and 4B and a mounting angle of each suction nozzle 5 of the same is corrected by the θ axis motor, and the suction nozzles 5 mount each electronic component onto the printed circuit board P while correcting the positional displacement (the step S09).

Figure 10:
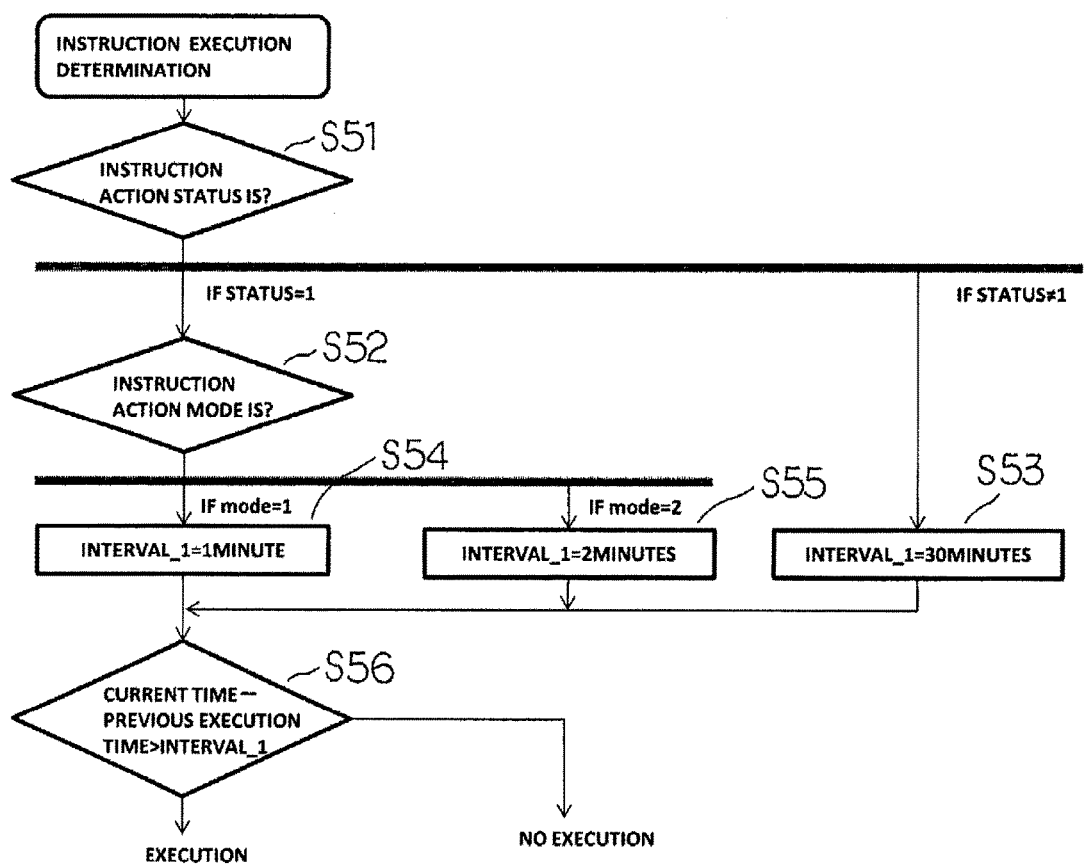
FIG. 10 is a view showing a flowchart concerning instruction execution determination.

Furthermore, to determine whether the instruction is to be executed (a step S10), the control microcomputer 30 advances to a flowchart of the instruction execution determination concerning FIG. 10. That is, an instruction status is determined (a step S51), and control is carried out to set an instruction interval to 30 minutes if the instruction status is not "1" (an instruction interval in a long-time mode) (a step S53).

Moreover, an instruction action mode is determined if the instruction status has been determined to be "1" (a step S22), control is carried out to set the instruction interval to 2 minutes if the instruction action mode has been determined to be mode "2" (a step S55), and the control is effected to set the instruction interval to 1 minute if the instruction action mode is mode "1" (a step S54).

Additionally, the control microcomputer 30 subtracts the previous instruction execution time from the current time, and it controls to execute the above-described instruction if a difference exceeds each of the above-described instruction intervals (1 minute, 2 minute, and 30 minutes) (a step S56).

Figure 11:
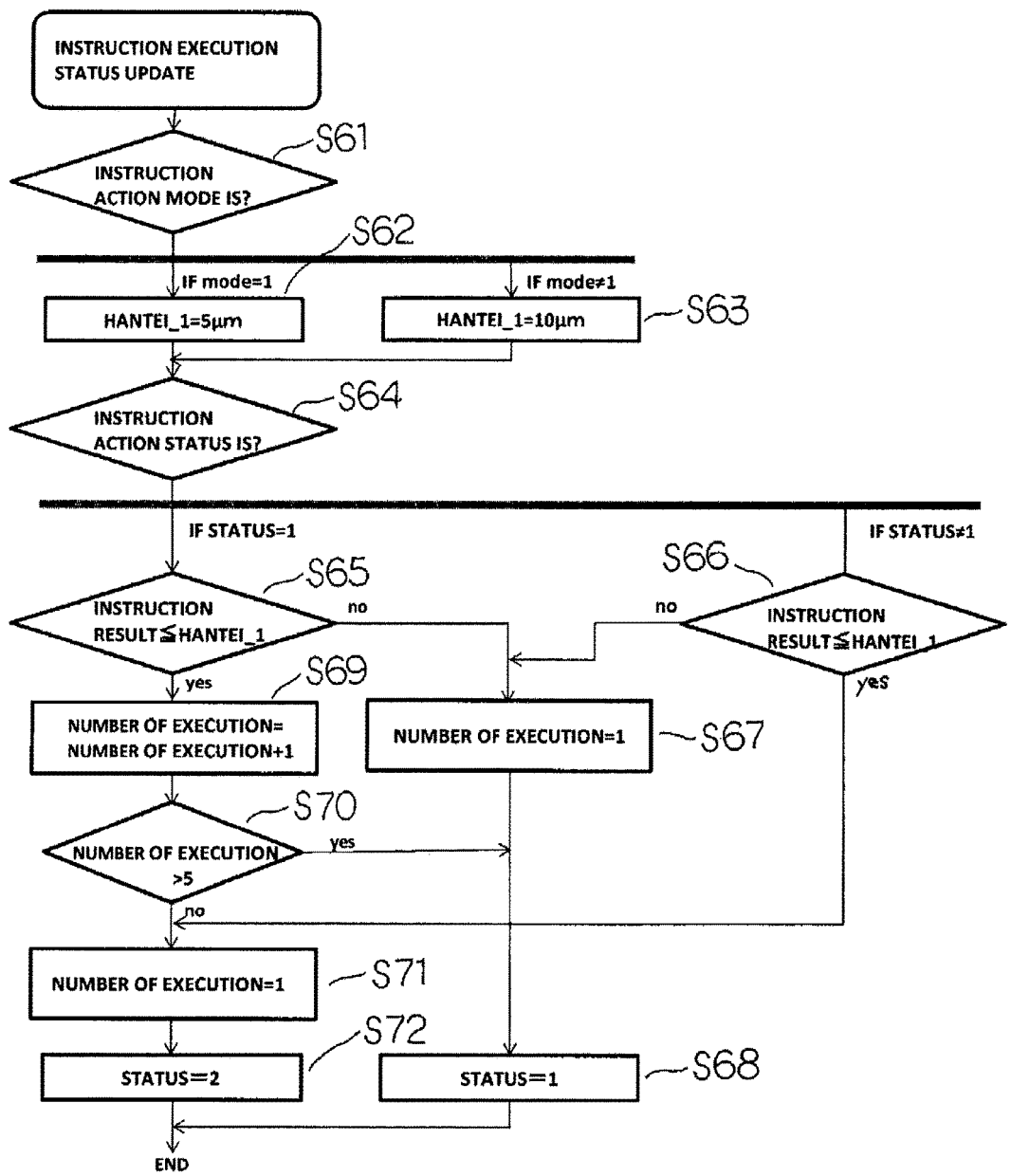
FIG. 11 is a view showing a flowchart concerning instruction execution status update.

Further, the control microcomputer 30 determines whether the instruction is to be executed (a step S10), advances to a step S13 if no execution is determined or executes the offset instruction of the rotation center of the mounting head 6 described above (a step S11) if the execution is determined, stores an instruction execution time and an offset value in the RAM as the memory device, updates the instruction execution status (a step S12), and advances to a flowchart of instruction execution status update shown in FIG. 11.

That is, the control microcomputer 30 determines which instruction action mode is being used (a step S61), sets the required accuracy to 10 μm if this instruction action mode is not mode "1" (a step S63), and sets the required accuracy to 5 μm if the instruction action mode is mode "1" (a step S62).

Then, the control microcomputer 30 determines which instruction action status is being provided (a step S64), determines whether an instruction result is 10 μm or 5 μm or less if the instruction action status is not STATUS "1" (a step S66), advances to a step S71 if the instruction result is 10 μm or 5 μm or less, or advances to a step S67 and sets the number of times of execution to "1" if the instruction result is not 10 μm or 5 μm or less, and sets the instruction action status to STATUS "1" (a step S68).

Whether the result of executing the instruction is 10 μm or 5 μm or less is determined if the instruction action status is STATUS "1" (a step S65), the processing advances to the step S67 where the number of times of execution is set to "1" and the instruction action status is set to STATUS "1" if the result of executing the instruction is not 10 μm or 5 μm or less, or the processing advances to a step S69 where "1" is added to set the number of times of execution to "2" if the result of executing the instruction is 10 μm or 5 μm or less. As described above, if the results of executing the instruction are continuously 10 μm or 5 μm or less as described above, the number of times of execution is incremented by "1" each time.

Then, whether the number of times of execution when the results of executing the instruction are continuously 10 μm or 5 μm or less is greater than "5" is determined (a step S70), and the number of times of execution is set to "1" (a step S71) and the instruction action status is set to STATUS "2" (a step S72) if this number is greater. Therefore, when STATUS "2" is set, control is executed to set each instruction interval to 30 minutes as indicated by steps S51 and S53 in FIG. 10. However, if the number of times of execution is less than "5", the instruction action status is set to STATUS "1" (the step S68).

As described above, the instruction execution status is updated (the step S12), clipping for the next linkage suction is performed (the step S13), then whether the action is stopped is determined (a step S14), performs control to stop if stoppage has been determined (a step S15), whether the current number is the last mounting step number in the mounting data is determined if non-stoppage has been determined (a step S16), an operation of returning to the step S07 is repeated if the number is not the last step number, or control is executed to eject the printed circuit board P from the circuit board positioning section and to effect conveyance from the circuit board supply section to the circuit board positioning section if the number is the last step number (a step S17).

As described above, the present invention can improve the mounting accuracy of each electronic component by executing the temperature compensation instruction in accordance with a changing device temperature. Further, since the instructions are executed at a longer interval than an interval according to the mid-operation instruction action mode if the instructions have continuously met the required accuracy more than once, the mounting accuracy of each electronic component can be improved without increasing the number of times of instruction concerning the offset value of the rotation center of the mounting head as much as possible.

Although the embodiment according to the present invention has been described above, persons skilled in the art can carry out various alternative examples, corrections, or modifications based on the above description, and the present invention includes the various alternative examples, corrections, or modifications without departing from the gist thereof.

INDUSTRIAL APPLICABILITY

The present invention can be used for an industrial robot or the like that images a component held by holding means provided at a rotatable work head with the use of a recognition camera and moves and mounts the component based on a result of performing recognition processing with respect to the acquired image.

REFERENCE SIGNS LIST

1 electronic component mounting device
2 conveying device
3 component supply device
3B component supply unit
4A, 4B beam
5 suction nozzle
6 mounting head
8 circuit board recognition camera
20 component recognition camera
30 control microcomputer

The invention claimed is:

1. A method for mounting an electronic component onto a circuit board, the method comprising:
   providing a mounting device including a rotatable mounting head, a holding means provided at the rotatable mounting head to hold the electronic component, a component recognition camera, a memory device and a microcomputer, the electronic component held by the holding means being mounted onto the circuit board based on a result of performing recognition processing by the microcomputer with respect to an acquired image by the component recognition camera;
   determining a mid-operation instruction action mode at start of a production operation of the circuit board;
   executing an instruction of obtaining an offset value relative to a rotation center of the rotatable mounting head and storing the offset value in the memory device at a time interval according to the determined mid-operation instruction action mode;
   executing the instruction at a longer time interval than the time interval according to the mid-operation instruction action mode when the instruction has continuously met a required accuracy more than once; and
   mounting the electronic component onto a circuit board after executing the instruction.

* * * * *